(12) United States Patent
Ramin

(10) Patent No.: US 11,842,986 B1
(45) Date of Patent: Dec. 12, 2023

(54) MULTI-CHIP MODULE (MCM) WITH INTERFACE ADAPTER CIRCUITRY

(71) Applicant: Eliyan Corporation, Santa Clara, CA (US)

(72) Inventor: Farjadrad Ramin, Los Altos, CA (US)

(73) Assignee: Eliyan Corporation, Santa Clara, CA (US)

( * ) Notice: Subject to any disclaimer, the term of this patent is extended or adjusted under 35 U.S.C. 154(b) by 0 days.

(21) Appl. No.: 17/973,905

(22) Filed: Oct. 26, 2022

Related U.S. Application Data

(60) Provisional application No. 63/283,265, filed on Nov. 25, 2021.

(51) Int. Cl.
*H01L 23/02* (2006.01)
*H01L 25/065* (2023.01)
*H01L 23/31* (2006.01)
*H01L 25/16* (2023.01)
*H01L 23/00* (2006.01)

(52) U.S. Cl.
CPC ...... *H01L 25/0657* (2013.01); *H01L 23/3107* (2013.01); *H01L 24/16* (2013.01); *H01L 25/16* (2013.01); *H01L 2224/16225* (2013.01); *H01L 2924/151* (2013.01); *H01L 2924/181* (2013.01)

(58) Field of Classification Search
CPC ..... H01L 23/3107; H01L 24/16; H01L 25/16; H01L 2224/16225; H01L 2924/151; H01L 2924/181
USPC ........................................................ 257/686
See application file for complete search history.

(56) References Cited

U.S. PATENT DOCUMENTS

| | | | |
|---|---|---|---|
| 6,031,729 A | 2/2000 | Berkely |
| 6,417,737 B1 | 7/2002 | Moloudi |
| 6,690,742 B2 | 2/2004 | Chan |
| 6,721,313 B1 | 4/2004 | Van Duyne |
| 6,932,618 B1 | 8/2005 | Nelson |
| 7,027,529 B1 | 4/2006 | Ohishi |
| 7,248,890 B1 | 7/2007 | Raghavan |
| 7,269,212 B1 | 9/2007 | Chau |

(Continued)

OTHER PUBLICATIONS

U.S. Appl. No. 16/812,234; Mohsen F. Rad, filed Mar. 6, 2020.

(Continued)

*Primary Examiner* — Jami Valentine Miller
*Assistant Examiner* — Dilinh P Nguyen
(74) *Attorney, Agent, or Firm* — Lance Kreisman; Peninsula Patent Group

(57) ABSTRACT

Semiconductor devices, packaging architectures and associated methods are disclosed. In one embodiment, a multi-chip module (MCM) is disclosed. The MCM includes a package substrate and a first integrated circuit (IC) chip disposed on the package substrate. The first IC chip includes first core circuitry, and first interface circuitry for communicating with the first core circuitry. A second IC chip is disposed on the package substrate and includes second core circuitry and second interface circuitry for communicating with the second core circuitry. The second interface circuitry exhibits a non-matching interface with respect to the first interface circuitry. Interface adapter circuitry couples to the first interface circuitry and the second interface circuitry to establish a common physical interface (PHY) for communicating between the first core circuitry and the second core circuitry.

18 Claims, 9 Drawing Sheets

(56) References Cited

U.S. PATENT DOCUMENTS

| | | |
|---|---|---|
| 7,477,615 B2 | 1/2009 | Oshita |
| 7,535,958 B2 | 5/2009 | Best |
| 7,701,957 B1 | 4/2010 | Bicknell |
| 7,978,754 B2 | 7/2011 | Yeung |
| 8,004,330 B1 | 8/2011 | Acimovic |
| 8,024,142 B1 | 9/2011 | Gagnon |
| 8,121,541 B2 | 2/2012 | Rofougaran |
| 8,483,579 B2 | 7/2013 | Fukuda |
| 8,546,955 B1 | 10/2013 | Wu |
| 8,861,573 B2 | 10/2014 | Chu |
| 8,948,203 B1 | 2/2015 | Nolan |
| 8,982,905 B2 | 3/2015 | Kamble |
| 9,088,334 B2 | 7/2015 | Chakraborty |
| 9,129,935 B1 | 9/2015 | Chandrasekar |
| 9,294,313 B2 | 3/2016 | Prokop |
| 9,349,707 B1 | 5/2016 | Sun |
| 9,379,878 B1 | 6/2016 | Lugthart |
| 9,432,298 B1 | 8/2016 | Smith |
| 9,832,006 B1 | 11/2017 | Bandi |
| 9,886,275 B1 | 2/2018 | Carlson |
| 9,961,812 B2 | 5/2018 | Suorsa |
| 10,171,115 B1 | 1/2019 | Shirinfar |
| 10,410,694 B1 | 9/2019 | Arbel |
| 10,439,661 B1 | 10/2019 | Heydari |
| 10,642,767 B1 | 5/2020 | Farjadrad |
| 10,678,738 B2 | 6/2020 | Dai |
| 10,735,176 B1 | 8/2020 | Heydari |
| 10,855,498 B1 | 12/2020 | Farjadrad |
| 10,935,593 B2 * | 3/2021 | Goyal .................... G01R 23/20 |
| 11,088,876 B1 | 8/2021 | Farjadrad |
| 11,100,028 B1 | 8/2021 | Subramaniam |
| 2002/0122479 A1 | 9/2002 | Agazzi |
| 2002/0136315 A1 | 9/2002 | Chan |
| 2004/0088444 A1 | 5/2004 | Baumer |
| 2004/0113239 A1 | 6/2004 | Prokofiev |
| 2004/0130347 A1 | 7/2004 | Moll |
| 2004/0156461 A1 | 8/2004 | Agazzi |
| 2005/0041683 A1 | 2/2005 | Kizer |
| 2005/0134306 A1 | 6/2005 | Stojanovic |
| 2005/0157781 A1 | 7/2005 | Ho |
| 2005/0205983 A1 | 9/2005 | Origasa |
| 2006/0060376 A1 | 3/2006 | Yoon |
| 2006/0103011 A1 | 5/2006 | Andry |
| 2006/0158229 A1 | 7/2006 | Hsu |
| 2006/0181283 A1 | 8/2006 | Wajcer |
| 2006/0188043 A1 | 8/2006 | Zerbe |
| 2006/0250985 A1 | 11/2006 | Baumer |
| 2006/0251194 A1 | 11/2006 | Bublil |
| 2007/0281643 A1 | 12/2007 | Kawai |
| 2008/0063395 A1 | 3/2008 | Royle |
| 2008/0143422 A1 | 6/2008 | Lalithambika |
| 2008/0186987 A1 | 8/2008 | Baumer |
| 2008/0222407 A1 | 9/2008 | Carpenter |
| 2009/0113158 A1 * | 4/2009 | Schnell .................... G06F 1/10 |
| | | 711/E12.001 |
| 2009/0154365 A1 | 6/2009 | Diab |
| 2009/0174448 A1 | 7/2009 | Zabinski |
| 2009/0220240 A1 | 9/2009 | Abhari |
| 2009/0225900 A1 | 9/2009 | Yamaguchi |
| 2009/0304054 A1 | 12/2009 | Tonietto |
| 2010/0177841 A1 | 7/2010 | Yoon |
| 2010/0197231 A1 | 8/2010 | Kenington |
| 2010/0294547 A1 | 11/2010 | Hatanaka |
| 2011/0029803 A1 | 2/2011 | Redman-White |
| 2011/0038286 A1 | 2/2011 | Ta |
| 2011/0167297 A1 | 7/2011 | Su |
| 2011/0187430 A1 | 8/2011 | Tang |
| 2011/0204428 A1 | 8/2011 | Erickson |
| 2011/0267073 A1 | 11/2011 | Chengson |
| 2011/0293041 A1 | 12/2011 | Luo |
| 2012/0082194 A1 | 4/2012 | Tam |
| 2012/0182776 A1 | 7/2012 | Best |
| 2012/0192023 A1 | 7/2012 | Lee |
| 2012/0216084 A1 | 8/2012 | Chun |
| 2012/0327818 A1 | 12/2012 | Takatori |
| 2013/0222026 A1 | 8/2013 | Havens |
| 2013/0249290 A1 | 9/2013 | Buonpane |
| 2013/0285584 A1 | 10/2013 | Kim |
| 2014/0016524 A1 | 1/2014 | Choi |
| 2014/0048947 A1 | 2/2014 | Lee |
| 2014/0126613 A1 | 5/2014 | Zhang |
| 2014/0192583 A1 | 7/2014 | Rajan |
| 2014/0269860 A1 | 9/2014 | Brown |
| 2014/0269983 A1 | 9/2014 | Baeckler |
| 2015/0012677 A1 | 1/2015 | Nagarajan |
| 2015/0172040 A1 | 6/2015 | Pelekhaty |
| 2015/0180760 A1 | 6/2015 | Rickard |
| 2015/0206867 A1 | 7/2015 | Lim |
| 2015/0271074 A1 | 9/2015 | Hirth |
| 2015/0326348 A1 | 11/2015 | Shen |
| 2015/0358005 A1 | 12/2015 | Chen |
| 2016/0056125 A1 | 2/2016 | Pan |
| 2016/0071818 A1 | 3/2016 | Wang |
| 2016/0111406 A1 | 4/2016 | Mak |
| 2016/0217872 A1 | 7/2016 | Hossain |
| 2016/0294585 A1 | 10/2016 | Rahman |
| 2017/0317859 A1 | 11/2017 | Hormati |
| 2017/0331651 A1 | 11/2017 | Suzuki |
| 2018/0010329 A1 | 1/2018 | Golding, Jr. |
| 2018/0082981 A1 | 3/2018 | Gowda |
| 2018/0175001 A1 | 6/2018 | Pyo |
| 2018/0190635 A1 | 7/2018 | Choi |
| 2018/0315735 A1 | 11/2018 | Delacruz |
| 2019/0044764 A1 | 2/2019 | Hollis |
| 2019/0058457 A1 | 2/2019 | Ran |
| 2019/0108111 A1 | 4/2019 | Levin |
| 2019/0198489 A1 | 6/2019 | Kim |
| 2020/0373286 A1 | 11/2020 | Dennis |
| 2021/0082875 A1 | 3/2021 | Nelson |
| 2021/0181974 A1 | 6/2021 | Ghosh |
| 2021/0183842 A1 | 6/2021 | Fay |
| 2021/0258078 A1 | 8/2021 | Meade |
| 2022/0159860 A1 | 5/2022 | Winzer |
| 2022/0223522 A1 | 7/2022 | Scearce |
| 2023/0039033 A1 | 2/2023 | Zarkovsky |
| 2023/0090061 A1 | 3/2023 | Zarkovsky |

OTHER PUBLICATIONS

Farjadrad et al., "A Bunch of Wires (BoW) Interface for Inter-Chiplet Communication", 2019 IEEE Symposium on High-Performance Interconnects (HOTI), pp. 27-30, Oct. 2019.

* cited by examiner

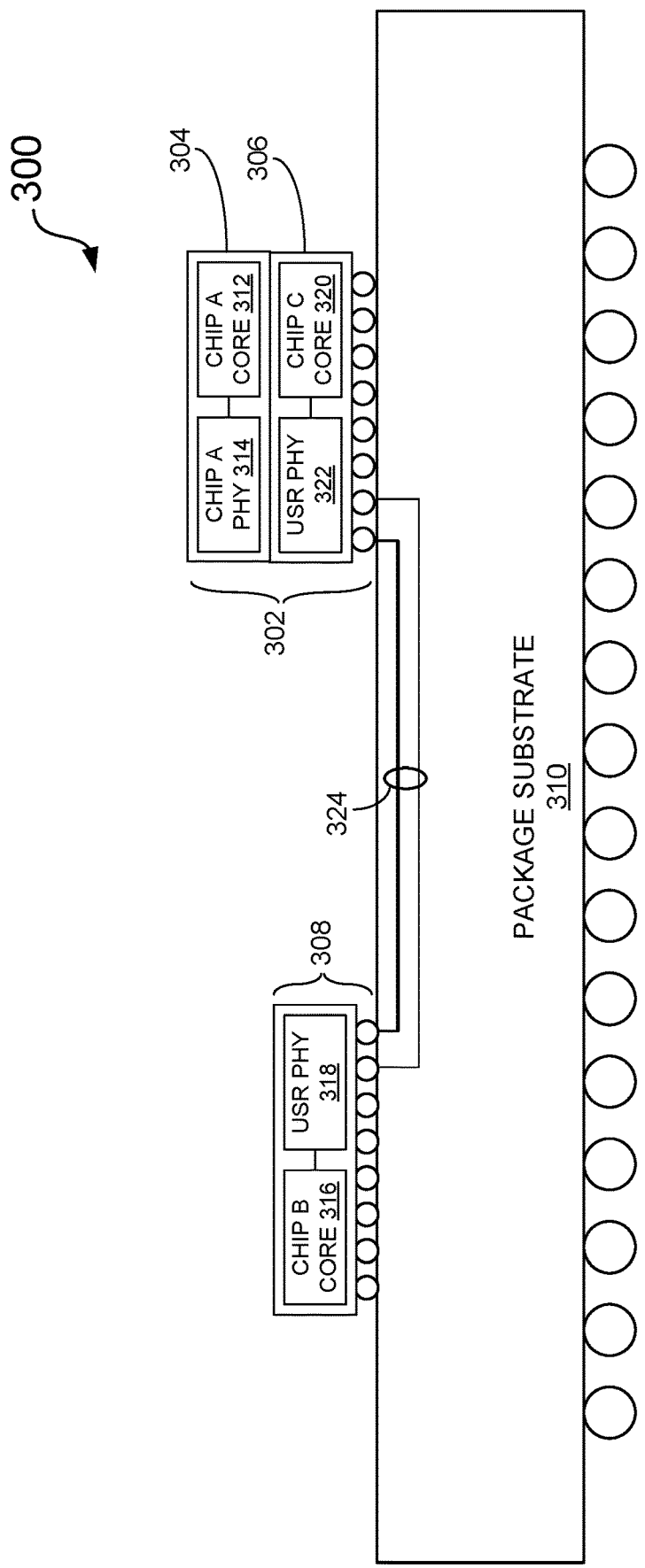

MULTI-CHIP MODULE (MCM) WITH INTERFACE ADAPTER CIRCUITRY

CROSS-REFERENCE TO RELATED APPLICATIONS

This application is a Non-Provisional that claims priority to U.S. Provisional Application No. 63/283,265, filed Nov. 25, 2022, entitled ENABLING ADVANCE SYSTEM-IN-PACKAGE ARCHITECTURES AT LOW-COST USING HIGH-BANDWIDTH ULTRA-SHORT-REACH (USR) CONNECTIVITY IN MCM PACKAGES, which is incorporated herein by reference in its entirety.

TECHNICAL FIELD

The disclosure herein relates to semiconductor devices, packaging and associated methods.

BACKGROUND

As integrated circuit (IC) chips such as system on chips (SoCs) become larger, the yields realized in manufacturing the chips become smaller. Decreasing yields for larger chips increases overall costs for chip manufacturers. To address the yield problem, chiplet architectures have been proposed that favor a modular approach to SoCs. The solution employs smaller sub-processing chips, each containing a well-defined subset of functionality. Chiplets thus allow for dividing a complex design, such as a high-end processor or networking chip, into several small die instead of one large monolithic die.

While beneficial in improving the yield issue for larger die, chiplet-based architectures for multi-chip modules (MCMs) often employ costly packaging components and associated processes.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 3 illustrates one embodiment of an MCM similar to FIG. 1 with the interface adapter circuitry including a gearbox chiplet stacked vertically with a first chip that has an unmatched interface with a second chip, and where the gearbox chiplet provides the common PHY to interconnect the two chips.

DETAILED DESCRIPTION

Semiconductor devices, packaging architectures and associated methods are disclosed. In one embodiment, a multi-chip module (MCM) is disclosed. The MCM includes a package substrate and a first integrated circuit (IC) chip disposed on the package substrate. The first IC chip includes first core circuitry, and first interface circuitry for communicating with the first core circuitry. A second IC chip is disposed on the package substrate and includes second core circuitry and second interface circuitry for communicating with the second core circuitry. The second interface circuitry exhibits a non-matching interface with respect to the first interface circuitry. Interface adapter circuitry couples to the first interface circuitry and the second interface circuitry to establish a common physical interface (PHY) for communicating between the first core circuitry and the second core circuitry. By employing the interface adapter circuitry, multiple chiplets in an MCM having non-matching interfaces may be interconnected in a straightforward manner. Other embodiments utilize interface adapter circuitry in the form of interface adapter chiplets that allow the MCM to include less-costly package substrates, such as non-silicon substrates, thereby reducing device costs without sacrificing performance.

Figure 1:
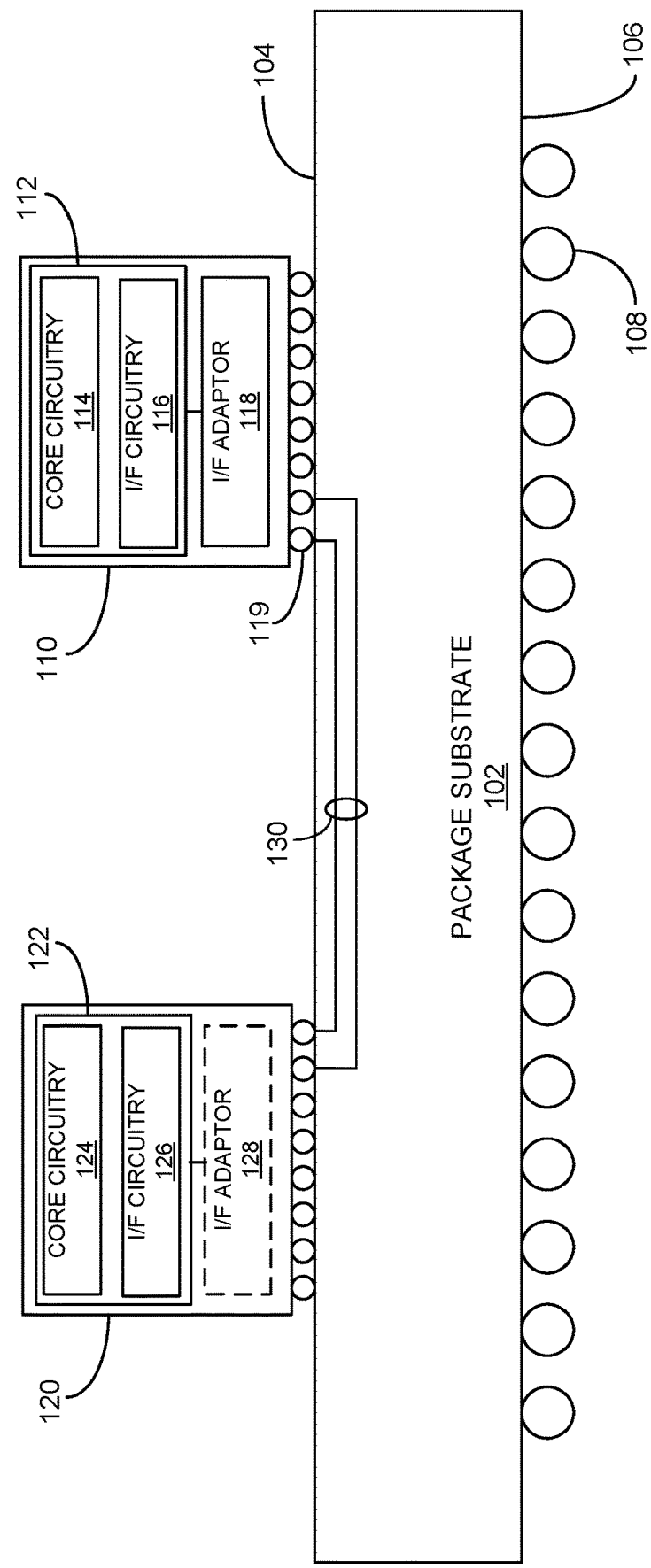
FIG. 1 illustrates a high-level embodiment of a multi-chip module (MCM), including a first integrated circuit (IC) chip assembly in communication with a second IC chip assembly via interface adapter circuitry that establishes a common physical interface (PHY).

Throughout the disclosure provided herein, the term multi-chip module (MCM) is used to represent a semiconductor device that incorporates multiple semiconductor die or sub-packages in a single unitary package. An MCM may also be referred to as a system in a chip (SiP). With reference to FIG. 1, a multi-chip module (MCM) is shown, generally designated 100. For one embodiment, the MCM includes a package substrate 102 that is formed with a device mounting surface 104 and an external interface surface 106 that includes, for example, bump contacts 108. While not shown in FIG. 1, paths formed in the substrate 102 connect certain ones of the external interface contacts 108 to corresponding pads on the device mounting surface 104 to provide, for example, power, ground and other signals to the MCM 100.

Further referring to FIG. 1, for some embodiments, the package substrate 102 is formed from a non-silicon material, such as an organic material. The use of a non-silicon package substrate 102 avoids size and signaling constraints typically associated with silicon-based substrates. This allows the substrate 102 to be larger, incorporate a more relaxed bump pitch for the external interface contacts 108, and provide low-loss traces. Additionally, non-silicon package substrates are less costly than silicon substrates such as silicon interposers.

With continued reference to FIG. 1, a first semiconductor device 110 is mounted to the device mounting surface 104 of the package substrate 102. For one embodiment, the first semiconductor device 110 includes a first integrated circuit (IC) die 112, or chip, that includes first logic or memory core circuitry 114 that is coupled to first interface circuitry 116. The first interface circuitry 116 may employ a specific mechanical interface such as a certain mounting pad or bond pad array, and/or a certain electrical interface such as a PCI-express interface with standardized PCIe pins or a memory interface with certain clock, data, command, control and address pins. For some embodiments, the first IC die 112 is packaged in a sub-package assembly.

Further referring to FIG. 1, the first semiconductor device 110 includes a first interface adapter 118 that couples to the first interface circuitry 116 of the first IC die 112. For some embodiments, the first interface adapter 118 takes the form of an IP block, or circuit, that may be formed in the first IC die 112. In other embodiments, the first interface adapter 118 is realized as a separate IC chip having a specialized function, often referred to as a chiplet. For one embodiment, the first interface adapter 118 is generally configured to provide a conversion functionality such that the first IC die 112 is able to transmit and/or receive signals to and/or from a second semiconductor device 120 that has a non-matching interface with the first interface circuitry 116 of the first die 112. The conversion provided by the first interface adapter 118 may involve converting the mechanical interface and/or the electrical interface of the first interface circuitry 116 to a conversion interface having a format that is compatible for supporting communications with the second semiconductor device 120. The first interface adapter 118 couples to a first external interface 119, such as contact bumps, formed on a mounting surface of the first semiconductor device 110. Further details for two embodiments of the interface adapter circuitry 118 are described below and shown in FIGS. 2A and 2B. While FIG. 1 shows blocks that appear vertically arranged, the blocks are merely logical blocks and are not necessarily physically arranged in a vertical manner. Thus, as will be apparent from further detailed embodiments described below, the interface adapter 118 may be arranged vertically with the first IC die 112 to form a 3D packaging architecture or horizontally with the first IC die 112 to form a 2.5D packaging architecture.

With continued reference to FIG. 1, the second semiconductor device 120 is formed similar to the first semiconductor device 110, including a second IC chip 122 that has second core circuitry 124 (that may be different than the first core circuitry 114), and second interface circuitry 126. As noted above, for some embodiments, the second interface circuitry 126 does not match the first interface circuitry 116. In some circumstances, the second interface circuitry 126 may exhibit an interface that matches the conversion interface provided by the first interface adapter 118. In other situations, the second interface circuitry 126 neither matches the first interface circuitry 116 nor the conversion interface provided by the first interface adapter 118. In such a circumstance, the second semiconductor device 120 includes a second interface adapter 128 (shown in phantom to denote that it is optional, depending on the application) that converts the mechanical interface and/or the electrical interface of the second interface circuitry 126 to a common format (such as the conversion interface provided by the interface adapter 118) that is compatible for supporting communications with the first semiconductor device 120.

Further referring to FIG. 1, for one embodiment, the non-silicon package substrate 102 includes traces 130 that form signaling links between the first interface adapter 118 and the second interface adapter 128 (or the second interface circuitry 126, in the event it already matches the conversion interface of the first interface adapter 118). For some embodiments, the links are high-speed short or long reach links that provide bandwidth capabilities that are similar to links incorporated by silicon substrates. For some embodiments, the links may take the form of unidirectional or bidirectional signaling links that may simultaneously communicate in both upstream and downstream directions. Thus, the first interface adapter 118, the substrate traces 130 and the second interface adapter 128 (when employed) cooperate to form interface adapter circuitry that provides a common interface to enable the first and second semiconductor devices 110 and 120 to communicate with each other via the inexpensive non-silicon substrate 102 at signaling rates similar to those supported by silicon substrates.

Figure 2A:
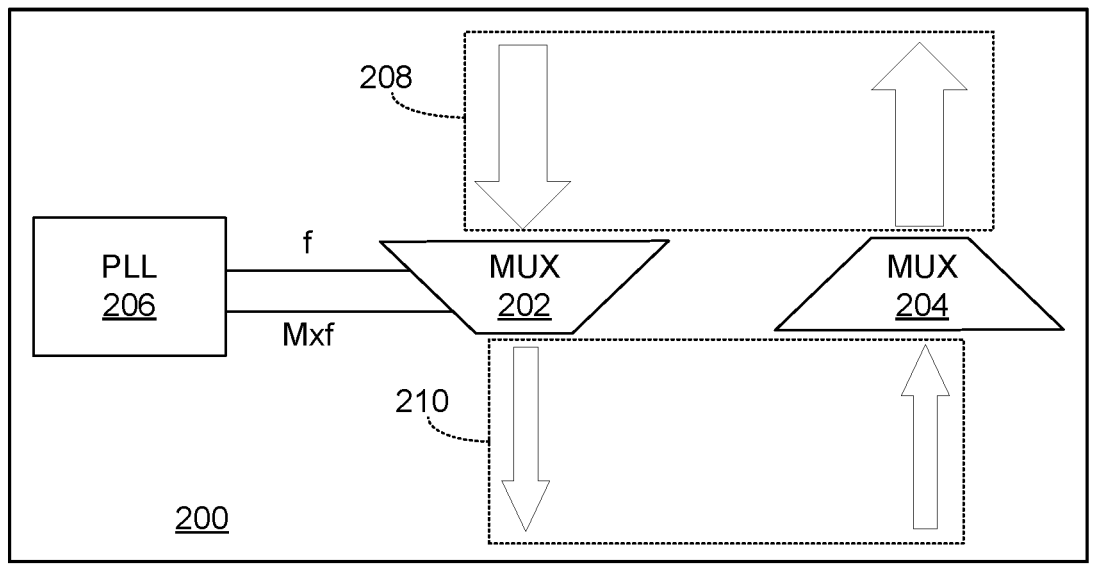
FIGS. 2A-2B illustrate embodiments of the interface adapter chiplets of FIG. 1.

FIG. 2A illustrates an example block diagram for one embodiment of an interface adapter chiplet 200 that may be used in the MCM 100 of FIG. 1. The interface adapter chiplet 200 includes a multiplexer 202, a de-multiplexer 204, and a clock source such as a phase locked loop (PLL) 206. The PLL 206 can be used to provide a range of frequencies between f and Mxf to support different data rates handled by the interface adapter chiplet 200. For example, the PLL 206 can include logic to convert bits from parallel data streams into serial data bits by alternating them on an up or down parts of the signals. M can include an integer value greater than 1. Any suitable implementation of the PLL 206 may be employed in the interface adapter chiplet 200.

(FIX) Further referring to FIG. 2A, for one embodiment, the multiplexer 202 includes a primary interface 208 that connects to a main chip (such as the first IC die 112 of FIG. 1) and a secondary interface 210 that connects to a substrate (such as the package substrate 102 of FIG. 1). As an example, the primary interface 208 may employ a wide (in terms of signaling paths) low speed I/O data interface, while the secondary interface 210 may implement a narrow high speed I/O data interface that, for example, couples to multiple unidirectional links that may operate sequentially or simultaneously. In various embodiments, the primary and secondary interfaces 208 and 210 may be connected between the main chip 112 and the substrate 102 using direct via-via connections, or over metal trace routings, such as metal paths provided in a package redistribution layer (RDL).

Figure 2B:
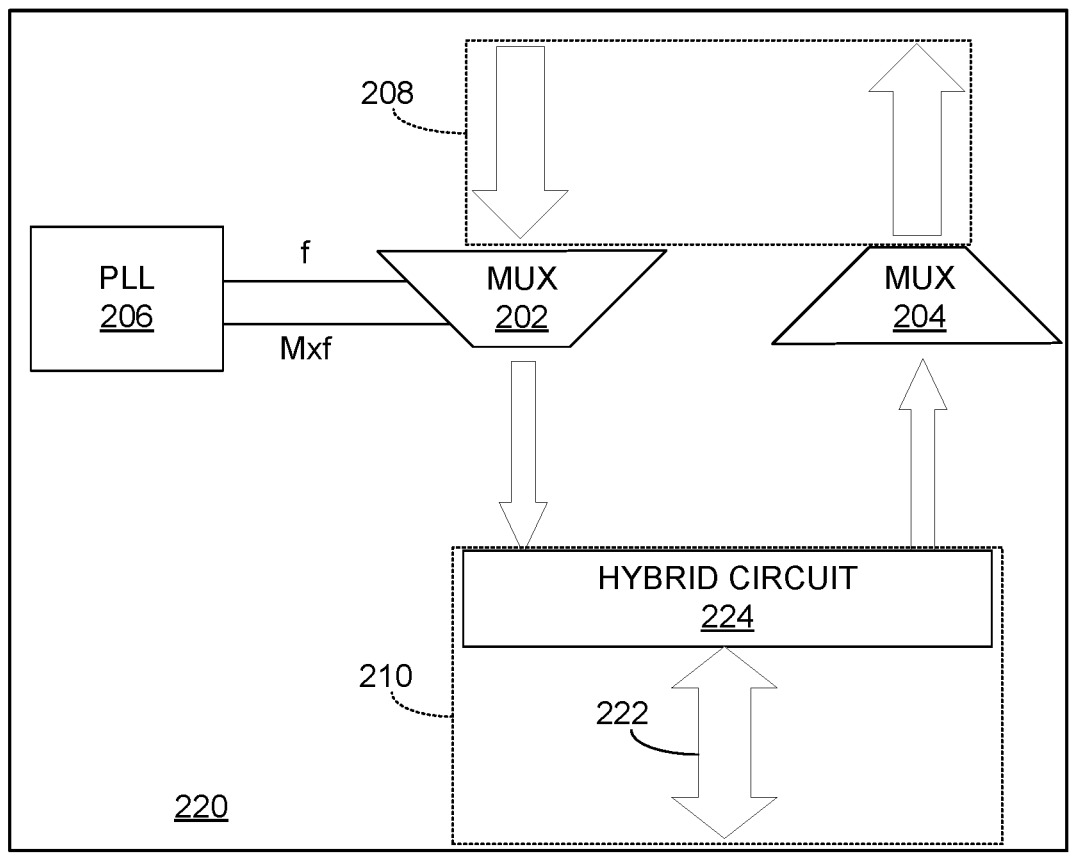

FIG. 2B illustrates a further embodiment of an interface adapter chiplet, generally designated 220, that is configured similarly to the embodiment of FIG. 2A, but instead of coupling to unidirectional links in the secondary interface 210, the secondary interface couples to bidirectional links, such as at 222, that are each capable of simultaneously transmitting and receiving data. A hybrid circuit 224 manages transmission and reception of data for transfer via the bidirectional link 222. Other embodiments and associated details for various interface adapter chiplet configurations are described in U.S. patent application Ser. No. 16/812,234, titled "LOW COST SOLUTION FOR 2.5D AND 3D PACKAGING USING USR CHIPLETS", filed Mar. 6, 2020, assigned to the Assignee of the instant application, and incorporated by reference in its entirety.

While FIG. 1 shows logical blocks for the first and second semiconductor devices 110 and 120 that are not necessarily physically arranged in any particular manner, FIG. 3 illustrates a detailed embodiment of an MCM 300 that expands the generic features of the MCM 100 of FIG. 1 to include a particular physical layout for each semiconductor device. With this in mind, the MCM 300 includes a first semiconductor device 302 that incorporates a first IC die or chip 304 that is vertically stacked with an interface adapter chiplet 306 to communicate with a second semiconductor device 308 over a package substrate 310. The first IC chip 304 includes a chip core 312 coupled to a chip physical interface (PHY) 314. The second semiconductor device 308 takes the form of a second IC chip with a second chip core 316 that is coupled to a second physical interface 318. For one particular embodiment, the first physical interface 314 of the first IC chip 304 does not match the second physical interface 318 of the second IC chip 308.

In an effort to enable the first IC chip 304 to communicate with the second IC chip 308, for one embodiment the first IC chip 304 is vertically stacked (often referred to as 3D packaged) with the interface adapter chiplet 306 to form the packaged first semiconductor device 302. The interface adapter chiplet 306 may take the form of an interface adapter chip similar to that described above with respect to FIGS. 1, 2A and 2B, with its own chip core 320 and adapter chip interface 322 that includes a first interface portion, or primary interface, that matches up (in a mechanical and/or electrical manner) with the first chip physical interface 314, and a second interface portion, or secondary interface, that converts (mechanically and/or electrically) the first chip physical interface to the adapter chip interface which becomes a common interface, referred to herein as an ultra-short reach (USR) interface, for communication along the non-silicon substrate 310 via high-speed links 324. The vertical stacking of the first IC chip 304 on the interface adapter chiplet 306 may be accomplished in any of a variety of ways, including bonding the two die packages together and wire-bonding connections between the two die, or forming through-silicon-vias (TSVs) in one or more of the two die.

Further referring to FIG. 3, in some situations (such as that shown), the second semiconductor device 308 already incorporates the USR interface as the second physical interface 318. As a result, both semiconductor devices 302 and 308 are able to communicate with each other over the non-silicon substrate 310. In other situations, the second IC chip 308 may have a different chip interface as the first IC chip 304 and the USR interface 322. In such a circumstance, a second interface adapter chiplet (not shown) may be placed in the second semiconductor device 308 to convert the second chip interface to the common USR interface 322.

While the adapter interface chiplet 306 provides an interface conversion, or gearbox, functionality to convert a high-density, low-speed interface to a low-density, high-speed interface (and vice-versa), it also allows for utilizing a desired USR interface that is not only compatible with non-silicon substrates that cost less and are not subject to limited maximum areas (as silicon substrates), but also includes circuitry to transceiver signals at bandwidths similar to the original chip interfaces.

Figure 4:
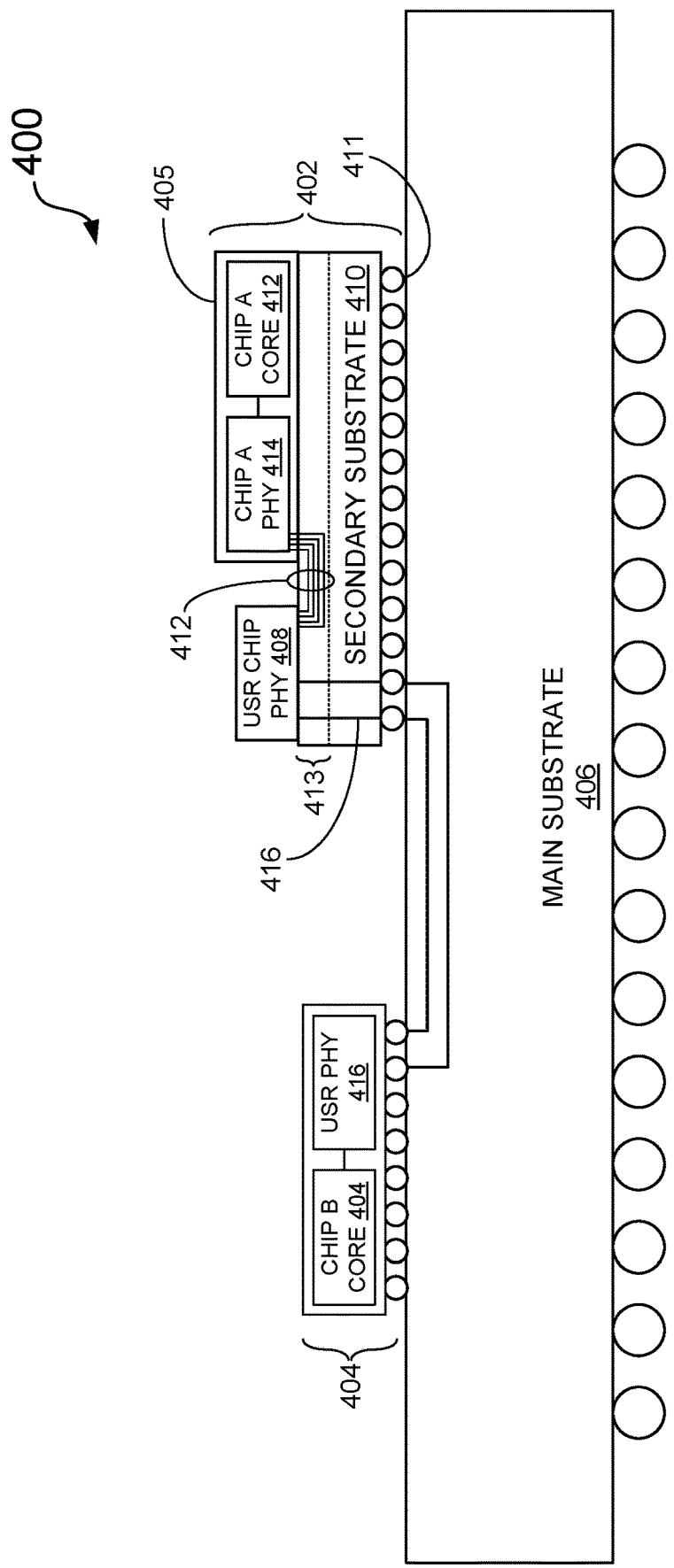
FIG. 4 illustrates a further embodiment of an MCM that is similar to FIG. 3, but with the gearbox chiplet disposed horizontally with the first chip and on a secondary substrate.

FIG. 4 illustrates a detailed embodiment of an MCM 400 that expands the generic features of the MCM 100 of FIG. 1 to include a particular horizontal, or 2.5D physical layout. Generally, the MCM 400 of FIG. 4 includes many of the features of what is shown in FIG. 3, with a first semiconductor device 402 in communication with a second semiconductor device 404 via a common USR interface over a package main substrate 406. While the first semiconductor device 302 of the MCM 300 of FIG. 3 is configured in a 3D manner, with the first IC die 304 stacked vertically with the adapter interface chiplet 306, a first semiconductor die 405 of the first semiconductor device 402 of FIG. 4 is packaged horizontally with an interface adapter chiplet 408 in a 2.5D manner. Generally speaking, 2.5D architectures that accomplish a similar functionality may be less costly than 3D architectures.

Further referring to FIG. 4, the first IC die 405 and the interface adapter chiplet 408 are both mounted in a horizontal relationship with each other on a secondary substrate 410. The secondary substrate 410 includes an array of contacts or bumps 411 that connect the secondary substrate 410 to the main package substrate 406. For some embodiments, the secondary substrate 410 may be formed as a silicon interposer, or as a non-silicon substrate formed, for example, as an epoxy-based mold material in a high-density fan-out (HDFO) process or a wafer-level fan-out (WLFO) process. The secondary substrate 410 provides for high-pitch and high-density signaling paths or traces, at 412, formed, for example, in an oxide layer 413 of the mold material between a first chip interface 414 and the interface adapter chiplet 408. For some embodiments, through-vias may be formed through the mold material, at 416, to provide low-density and high-bandwidth connections between the interface adapter chiplet 408 (which provides the common USR interface for transfers along the main substrate 406) and the main substrate 406.

Further referring to FIG. 4, for one embodiment, the second semiconductor device 404 is realized as a second IC chip that incorporates a USR interface 416 that seamlessly integrates with the USR interface of the interface adapter chiplet 408. The result is compatible communication between non-matching interfaces of the first semiconductor device 402 and the second semiconductor device 404 over a relatively inexpensive non-silicon main package substrate 406.

Figure 5:
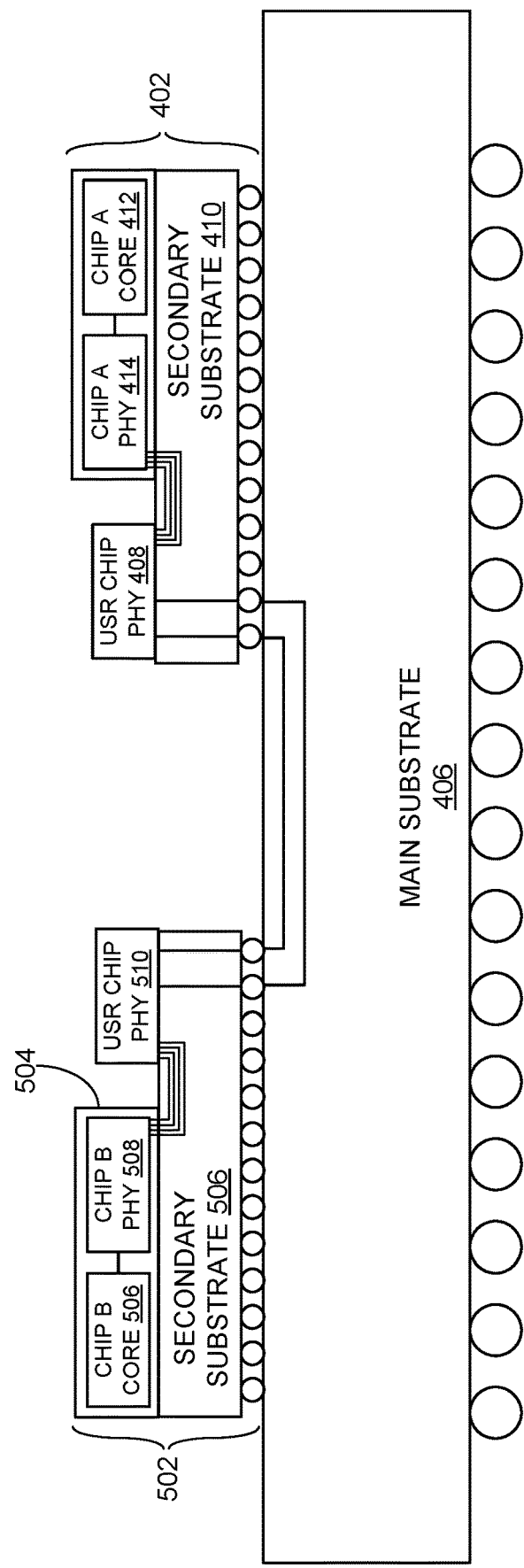
FIG. 5 illustrates an embodiment of an MCM that is similar to that shown in FIG. 4.

In some circumstances, the MCM 400 of FIG. 4 may incorporate a second semiconductor device 404 that employs an interface that doesn't match either of the first IC die interface 414 or the USR interface 416. FIG. 5 illustrates such a situation, with a second semiconductor device 502 including a second IC die 504 with a second core 506 and a second physical interface 508 that is coupled to a second interface adapter chiplet 510 in a 2.5D configuration, and mounted on a secondary substrate 506 similar to the secondary substrate 410 of the MCM 400 of FIG. 4. The second interface adapter chiplet 510 will have a different primary interface (that matches the second IC die physical interface 508) than the first adapter interface chiplet 408 (which matches the first die physical interface 414). Both of the interface adapter chiplets 510 and 408 incorporate a same USR interface as a secondary interface that allows for communication between the first semiconductor device 402 and the second semiconductor device 502.

Figure 6:
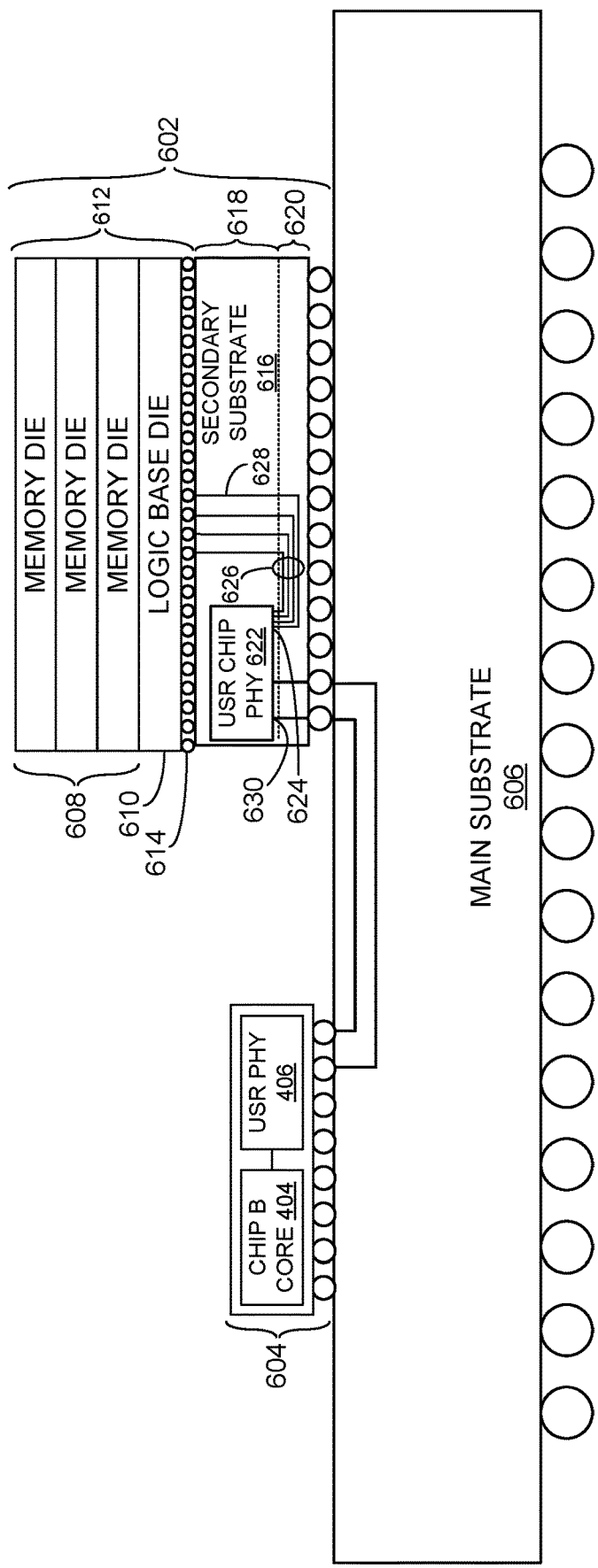
FIG. 6 illustrates one embodiment of an MCM similar to FIG. 3 with the interface adapter circuitry including a gearbox chiplet stacked vertically with a stack of memory chips and a logic chip that has an unmatched interface with a second chip, and where the gearbox chiplet provides the common PHY to interconnect the two chips.

FIG. 6 illustrates an MCM, generally designated 600, that includes a first semiconductor device 602 that communicates with a second semiconductor device 604 over a main package substrate 606. The MCM 600 is similar to the MCM 300 of FIG. 3, but with a different configuration of stacked chips associated with the first semiconductor device 602.

Further referring to FIG. 6, for one embodiment, the first semiconductor device 602 includes a stack of memory die 608 disposed on a logic base die 610. For some embodiments, the logic base die 610 is configured as an interface die for the stack of memory die 608 and may be compatible with high-bandwidth memory (HBM) standards. The stack of memory die 608 and the logic base die 610 may be packaged together as a sub-package 612, with the logic base die 610 further formed with an external interface in the form of an array of contact bumps, at 614.

With continued reference to FIG. 6, the sub-package 612 is mounted to a secondary substrate 616 that, for one embodiment, takes a form similar to the secondary substrate 410 shown in FIGS. 4 and 5. In one embodiment, the secondary substrate 616 is formed with a mold layer of an epoxy material, at 618, and an oxide layer, at 620. The mold layer 618 encapsulates an interface adapter chiplet 622. A primary interface 624 of the interface adapter chiplet 622 connects to traces 626 formed in the oxide layer of the secondary substrate 616. Through-vias 628 formed in the epoxy mold layer 618 connect the traces of the oxide layer 620 to the external interface 614 of the stacked-die sub-package 612. A secondary interface 630 of the interface adapter chiplet 622 provides, for example, a common USR interface for communicating with the second semiconductor device 604 over the main package substrate 606, which may be formed of a non-silicon material. For this particular embodiment, all of the signal connections between the logic base die 610 and the interface adapter chiplet 622 are made through the vias 628 formed in the mold layer 618 and the traces 626 formed in the oxide layer 620 of the secondary substrate 616.

Figure 7A:
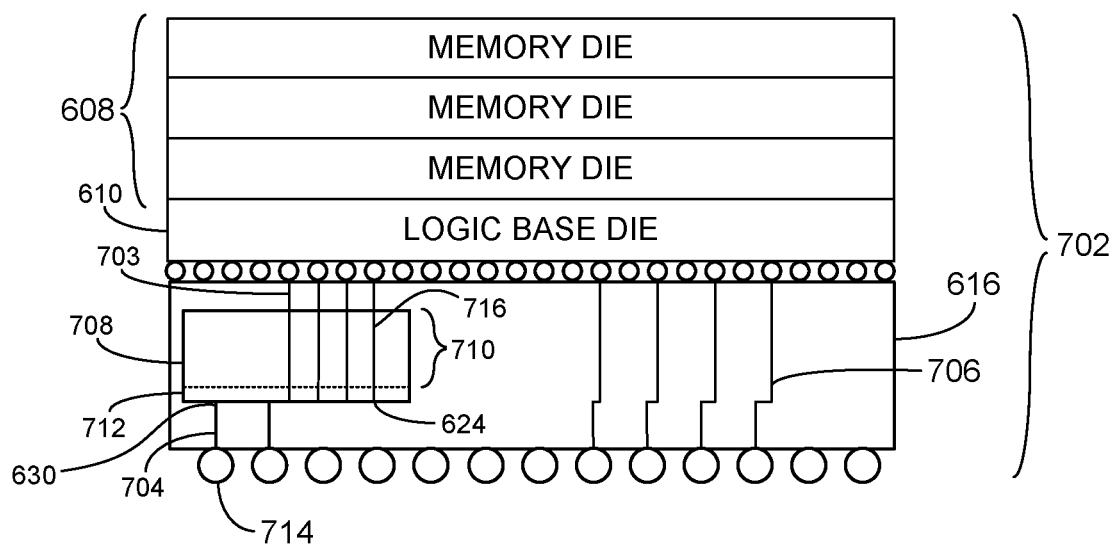
FIGS. 7A-7F illustrate various embodiments for the first chip assembly employed by the MCM of FIG. 6.

FIGS. 7A-7F illustrate alternative embodiments of the first semiconductor device 602 of the MCM 600 of FIG. 6. The various embodiments provide cost alternatives in configuring the stacked-die sub-package 612 with the interface adapter chiplet 622 nested in the epoxy mold layer 618 of the secondary substrate 616. While the embodiments described below relate to variations of the first semiconductor device 602, they are equally applicable to the second semiconductor device 604. For example, FIG. 7A illustrates a die stack for a first semiconductor device 702 that is similar to the first semiconductor device 602 shown in FIG. 6, including a stack of memory die 608 mounted on a logic base die 610. The secondary substrate 616 includes an epoxy-based mold layer, but may optionally include an oxide layer (not shown) for trace routing. For this particular embodiment, all conductive paths in the mold layer are formed as through vias or partial (blind) vias, such as at 703, 704 and 706. The mold layer encapsulates an interface adapter chiplet 708 that is formed with a base silicon substrate, at 710, and an active silicon layer, at 712. For one embodiment, the interface adapter chiplet 708 is installed in the mold material such that the active surface layer of the adapter chiplet 708 is disposed proximate an external interface 714 of the first semiconductor device 602. Connections from the logic base die 610 to the primary interface 624 of the interface adapter chiplet 708 (formed in the active silicon layer 712 of the chiplet) are carried out with the partial mold vias, at 703, and through-silicon vias (TSVs) formed through the interface adapter chiplet 708, such as at 716. The secondary interface 630 of the interface adapter chiplet 708 connects with the external interface bumps 714 of the first semiconductor device 602 using the vias 704. For this embodiment, having the flexibility to optionally omit the oxide layer of the secondary substrate 616 may reduce costs associated with configuring the first semiconductor device 702.

Figure 7B:
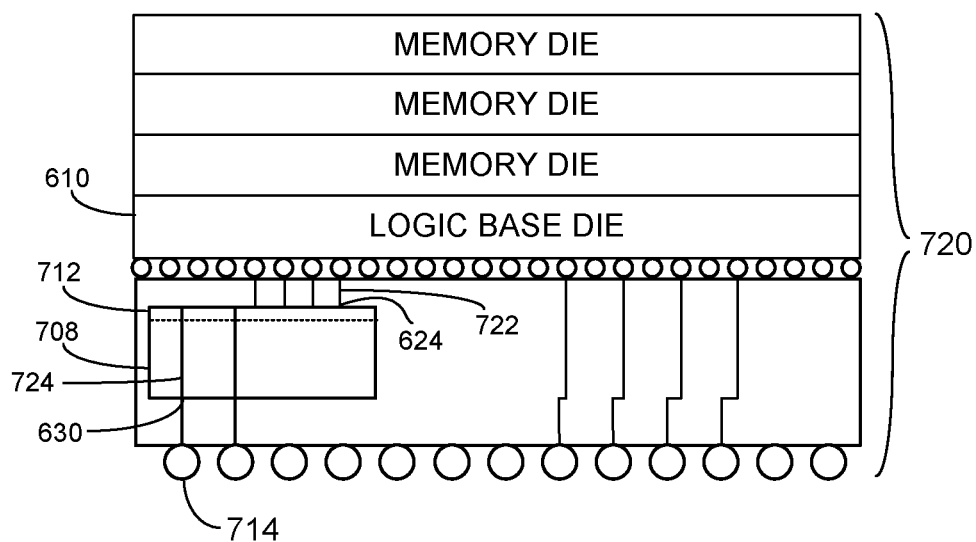

FIG. 7B illustrates a further embodiment of a first semiconductor device 720 that is similar to the first semiconductor device 702 of FIG. 7A, but which flips the interface adapter chiplet 708 such that the active silicon layer 712 is proximate the logic base die 610. As a result, the connections from the logic base die 610 to the primary interface 624 of the interface adapter chiplet 708 (which are high-density but low data rate) may be made by partial mold vias only, at 722, while a limited number of through-silicon vias are formed in the interface adapter chiplet 708, at 724, to couple the secondary interface 630 to the external interface bumps 714 of the first semiconductor device 720. This particular embodiment may save costs by reducing the number of through-silicon vias (TSVs) formed in the interface adapter chiplet 708, which are generally more expensive than mold vias.

Figure 7C:
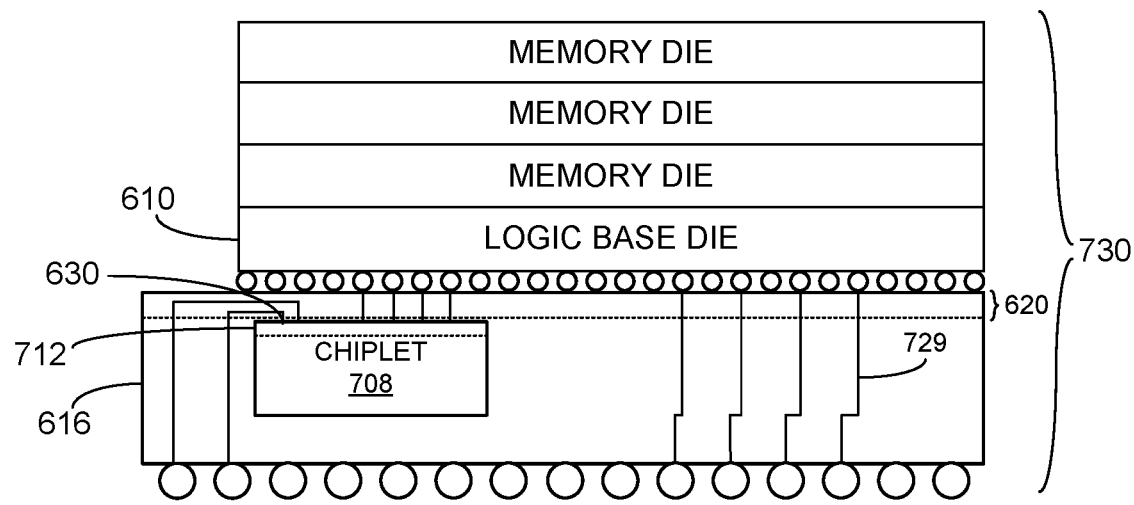

FIG. 7C illustrates a further embodiment of a first semiconductor device 730 that is similar to the first semiconductor device 602 of FIG. 6, in that it avoids any TSVs being formed in the interface adapter chiplet 708, but which includes an oxide layer 620 in the secondary substrate 616 to route signals from the secondary interface 630 of the interface adapter chiplet 708. With the interface adapter chiplet 708 having its active silicon layer 712 positioned close to the logic base die 610, all connections to the interface adapter chiplet 708 may be made along the oxide layer 620. One or more through-mold vias may be made, at 729, for example, to carry out power, ground or other electrical connections for the first semiconductor device 730.

In some situations, having the interface adapter chiplet 708 disposed at one end of the secondary substrate 616 and encapsulated by the epoxy mold layer 618 can, during operation, result in thermal gradients emanating from the interface adapter chiplet end of the secondary substrate 616, due to power dissipation of the chiplet, to the other end of the secondary substrate 616. The different thermal effects acting on the different ends of the secondary substrate 616 may impact the expected lifespan of the electrical connections established by the external interface contact bumps on either surface of the secondary substrate 616. Further, the epoxy mold material may exhibit a higher hardness or durometer profile at the interface adapter chiplet end as compared to the non-chiplet end, which may impact its suitability as a base material for large die stacks. To address these effects, one embodiment of a first semiconductor device 740, shown in FIG. 7D, incorporates a dummy silicon die 742 to, during operation, exhibit a thermal and hardness profile similar to the interface adapter chiplet 708. The added durability and thermal effects from the dummy die 742 assists in maintaining a consistent thermal and hardness profile across the secondary substrate 616, and thus improving the longevity and reliability of the first semiconductor device 740.

Figure 7D:
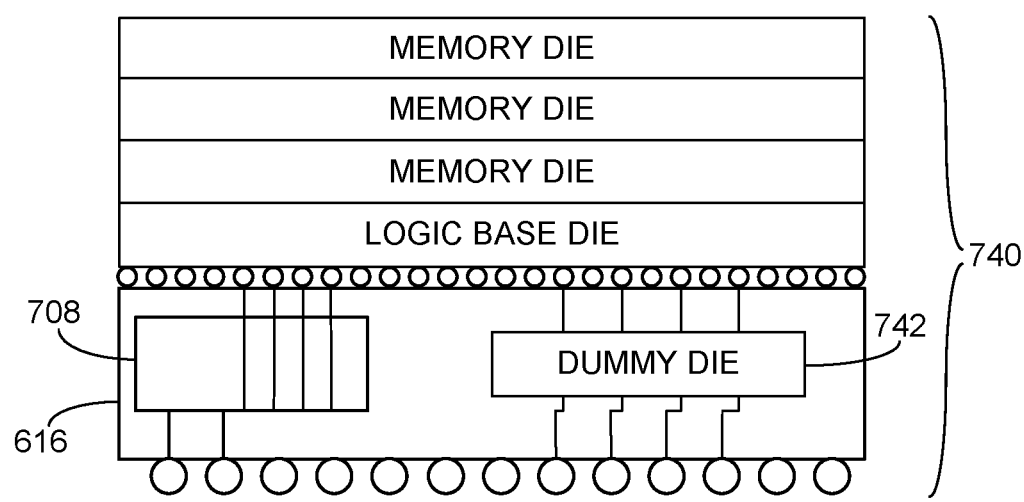
Figure 7E:
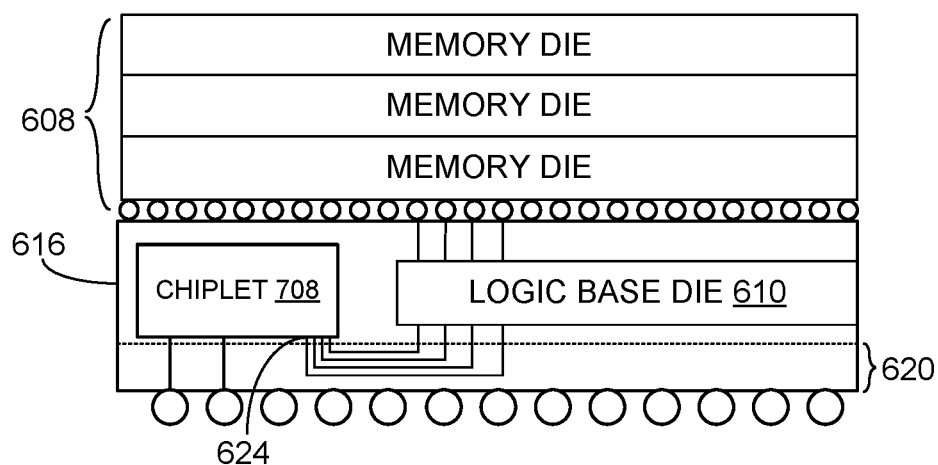
Figure 7F:
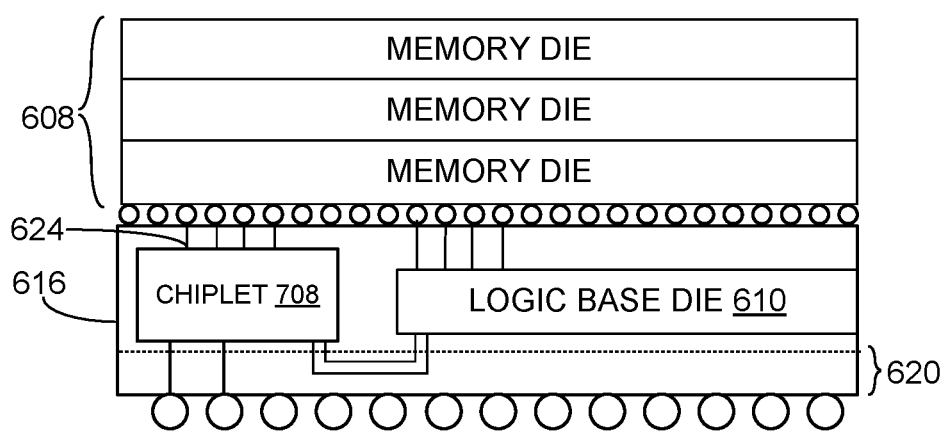

FIG. 7E illustrates an embodiment of a first semiconductor device 750 that is similar to that shown in FIG. 7D, but which substitutes the logic base die 610 of the sub-package 612 (FIG. 6) for the dummy silicon die 742 into the secondary substrate 616. All connections from the memory die stack 608 run through the logic base die 610, then along the oxide layer 620 of the secondary substrate 616 to the primary interface 624 of the interface adapter chiplet 708. FIG. 7F illustrates a similar embodiment, but includes provisions for data paths of the primary interface 624 of the interface adapter chiplet 708 to interconnect directly to the memory die stack 608 and to receive control signals from the logic base die 610 via relatively few traces formed in the oxide layer 620 of the secondary substrate 616. This reduces the trace density needed in the oxide layer 620, which may result in reduced costs. The active device layer of the interface adapter chiplet 708 may be oriented such that it is adjacent the memory die stack 608 or the oxide layer 620 of the secondary substrate 616.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A multi-chip module (MCM), comprising:
a package substrate;
a first integrated circuit (IC) chip disposed on the package substrate, the first IC chip including
first core circuitry, and
first interface circuitry for communicating with the first core circuitry;
a second IC chip disposed on the package substrate, the second IC chip including
second core circuitry, and
second interface circuitry for communicating with the second core circuitry, the second interface circuitry exhibiting a non-matching interface with respect to the first interface circuitry; and
interface adapter circuitry including an interface adapter IC chip, the interface adapter IC chip coupled to the first interface circuitry and the second interface circuitry to establish a common physical interface (PHY) for communicating between the first core circuitry and the second core circuitry.

2. The MCM of claim 1, wherein the interface adapter chip includes:
a first interface that matches the first interface circuitry of the first IC chip;
a first ultra-short-reach (USR) interface; and
a first conversion circuit coupled between the first interface and the first USR interface to convert a first set of signal paths that is compatible for connecting to the first interface to a second set of signal paths that is compatible for connecting to the first USR interface; and
wherein the MCM further includes at least one signaling link routed on the package substrate and configured to couple the first USR interface of the interface adapter IC chip to the second IC chip.

3. The MCM of claim 2, wherein:
the second interface circuitry for communicating with the second core circuitry comprises a second USR interface for communicating with the first USR interface of the interface adapter IC chip over the at least one signaling link.

4. The MCM of claim 2, wherein the interface adapter circuitry further comprises:
a second interface adapter IC chip, the second interface adapter IC chip including
a second interface that matches the second interface circuitry of the second IC chip;
a second ultra-short-reach (USR) interface; and
a second conversion circuit coupled between the second interface and the second USR interface to convert a third set of signal paths that is compatible for connecting to the second interface to a fourth set of signal paths that is compatible for connecting to the second USR interface, the second USR interface coupled to the at least one signaling link for communicating with the first USR interface of the interface adapter IC chip.

5. The MCM of claim 2, wherein:
the first IC chip is stacked vertically above the interface adapter IC chip.

6. The MCM of claim 2, wherein:
the interface adapter IC chip is encapsulated in a mold material to form a stack base; and
the first IC chip comprises a stack of IC chips mounted vertically on the stack base.

7. The MCM of claim 6, wherein the stack base further includes:
a dummy chip encapsulated in the mold material and positioned horizontally with respect to the interface adapter IC chip.

8. The MCM of claim 2, wherein the first IC chip further comprises:
a secondary substrate for mounting to the package substrate;
wherein the interface adapter IC chip is disposed on the secondary substrate; and
wherein the first IC chip is disposed on the secondary substrate and positioned in a horizontal relationship with the interface adapter IC chip.

9. The MCM of claim 2, wherein the first IC chip further comprises:
a secondary substrate for mounting to the package substrate;
wherein the interface adapter IC chip is disposed on the secondary substrate; and
wherein the first IC chip is disposed on the secondary substrate and positioned in a vertical relationship with the interface adapter IC chip.

10. A multi-chip module (MCM), comprising:
a non-silicon substrate;
a first integrated circuit (IC) chip assembly disposed on the non-silicon substrate, the first IC chip assembly including
multiple IC chips positioned in a vertical relationship to form a chip stack;
first interface circuitry for communicating with the multiple IC chips; and
an interface adapter chip stacked with the chip stack;
a second IC chip assembly disposed on the non-silicon substrate, the second IC chip assembly having second interface circuitry, the second interface circuitry exhibiting a non-matching interface with respect to the first interface circuitry; and
wherein the interface adapter chip is configured to establish a common physical interface (PHY) for communicating between the first interface circuitry and the second interface circuitry.

11. The MCM of claim 10, wherein:
the multiple IC chips of the chip stack comprise memory chips.

12. The MCM of claim 10, wherein:
the chip stack exhibits a footprint of a first surface area; and
the interface adapter chip exhibits a footprint of a second surface area that is less than the first surface area.

13. The MCM of claim 10, wherein:
the first interface circuitry comprises a first interface chip that is stacked with the chip stack.

14. The MCM of claim 10, wherein:
the first integrated circuit (IC) chip assembly includes a secondary substrate formed with a mold material that forms a base layer of the first IC chip assembly;
wherein the interface adapter chip is embedded in the secondary substrate; and
wherein the first interface circuitry comprises a first interface chip that is embedded in the secondary substrate and disposed in a horizontal relationship with the interface adapter chip.

15. The MCM of claim 10, wherein:
the interface adapter chip is encapsulated in a mold material to form a stack base that exhibits a surface area that approximates the first surface area; and
wherein the chip stack is stacked vertically on the stack base.

16. The MCM of claim 15, further comprising:
a first interface chip, the first interface chip being encapsulated in the mold material and being positioned in a horizontal relationship with the interface adapter chip.

17. The MCM of claim 15, wherein:
the interface adapter chip includes a first surface that is formed with an active device side;
the interface adapter chip is positioned in the mold material such that the active device layer is positioned proximate the non-silicon substrate;
wherein communication between the interface adapter chip and the chip stack is carried out by through-silicon-vias (TSVs) formed from the chip stack and through the interface adapter chip to the active device side; and
wherein communication between the interface adapter chip and the non-silicon substrate is carried out by direct routing paths from the non-silicon substrate to the active device side.

18. The MCM of claim 17, wherein:
the interface adapter chip includes a first surface that is formed with an active device side;
the interface adapter chip is positioned in the mold material such that the active device side is positioned proximate the chip stack;
wherein communication between the interface adapter chip and the non-silicon substrate is carried out by through-silicon-vias (TSVs) formed from the non-silicon substrate and through the interface adapter chip to the active device side; and
wherein communication between the interface adapter chip and the chip stack is carried out by direct routing paths from the chip stack to the active device side.

* * * * *